United States Patent
Abel et al.

(10) Patent No.: US 6,668,334 B1
(45) Date of Patent: Dec. 23, 2003

(54) APPARATUS FOR DETECTING CLOCK FAILURE WITHIN A FIXED NUMBER OF CYCLES OF THE CLOCK

(75) Inventors: Christopher John Abel, Whitehall, PA (US); Angelo Rocco Mastrocola, West Lawn, PA (US); Douglas Edward Sherry, Mertztown, PA (US); William Burdett Wilson, Macungie, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 582 days.

(21) Appl. No.: 09/604,842

(22) Filed: Jun. 27, 2000

(51) Int. Cl.[7] ................................................ G06F 1/04
(52) U.S. Cl. ........................ 713/500; 713/502; 327/20
(58) Field of Search .............................. 713/500, 502, 713/503, 600, 400, 401; 327/18, 20, 21, 156, 553; 331/1 R, 8, 11, 17, 25; 714/34, 48; 226/93

(56) References Cited

U.S. PATENT DOCUMENTS

| | | | |
|---|---|---|---|
| 4,142,159 A | * 2/1979 | Ingram et al. | 327/20 |
| 4,144,448 A | 3/1979 | Pisciotta et al. | 235/301 |
| 4,374,361 A | 2/1983 | Holden | 328/120 |
| 4,628,253 A | 12/1986 | Yu | 324/73 |
| 5,589,683 A | * 12/1996 | Nakai | 250/214 R |
| 5,828,243 A | 10/1998 | Bagley | 327/99 |
| 5,903,748 A | 5/1999 | McCollough et al. | 395/558 |
| 5,946,362 A | 8/1999 | Ha | 375/357 |
| 6,144,249 A | * 11/2000 | Tse | 327/539 |

FOREIGN PATENT DOCUMENTS

JP         01288914 A  * 11/1989  ............. G06F/1/04

OTHER PUBLICATIONS

DeWitt–C.—'Failsafe' Circuits for a Microprocessor, Jan. 1984—VLSI–Design (USA), vol. 5, No. 1, p. 74–5.*

* cited by examiner

Primary Examiner—Thomas M. Heckler
Assistant Examiner—Thuan Du

(57) ABSTRACT

A loss-of-clock (LOC) detector circuit detects a clock failure substantially within a specified number of clock periods and generates a loss-of-clock signal. The LOC detector includes a frequency-to-current converter which generates a charging current substantially proportional to a frequency of an input clock. A capacitor accepts the charging current and provides a terminal voltage that changes in response to the charging current. An edge detector receives the input clock signal as an input and produces an output pulse on an edge of the input clock signal. A switch is coupled to the capacitor such that the capacitor is discharged to a reference potential when the switch is closed. The switch is controlled by the edge detector to close when the edge detector output pulse is asserted. A comparator generates a loss-of-clock signal when the voltage on the capacitor passes a trip voltage of the comparator.

17 Claims, 9 Drawing Sheets

APPARATUS FOR DETECTING CLOCK FAILURE WITHIN A FIXED NUMBER OF CYCLES OF THE CLOCK

FIELD OF THE INVENTION

The invention pertains to the field of integrated circuits. More particularly, the invention pertains to an apparatus for detecting a clock failure in an integrated circuit.

BACKGROUND OF THE INVENTION

Digital and mixed-signal integrated circuits (ICs) usually depend on the presence of a clock, a signal consisting of a repetitive and ideally unchanging sequence of alternating digital '1's and '0's, to drive the sequential digital logic within these circuits. If the clock signal is disrupted, or stopped altogether, the digital circuits triggered off of this clock may function incorrectly or cease operation altogether. Such a disruption or stopping of the clock is referred to in the art as a "loss of clock." A loss-of-clock (LOC) detector—a circuit that monitors the clock signal and asserts a warning signal (flag) when the clock is disrupted—is thus clearly important in critical systems. The loss-of-clock detector warning signal may be used to indicate to the system controller that the clock has been disrupted, and that the data processed by the digital subsystems that depend on this clock may be corrupted. Alternatively, the warning signal may be used to force automatic selection of an alternative clock source if the primary clock signal is disrupted.

The concept of a loss-of-clock detector is well known in the art. As indicated in FIG. 1, a typical LOC detector 100 is implemented by using pull-up resistor 101 to charge capacitor 102 up to the supply voltage 103, and by using grounded switch 104 to discharge capacitor 102. A clock edge detector 105 causes switch 104 to close momentarily after each rising edge (transition from logic '0' to logic '1') and after each falling edge (transition from logic '1' to logic '0') of the input clock, CLK. The voltage across capacitor 102 is input to comparator 106, the output of which is the loss-of-clock signal (LOCFLG) 107. Comparator 106 operates in such a way that LOCFLG 107 is logic '1' whenever the comparator input voltage exceeds the comparator trip voltage and logic '0' otherwise. The comparator trip voltage is equal to the voltage of Voltage Reference 108, $V_{TR}$.

The values of resistor 101 and capacitor 102 are chosen so that the resulting resistor-capacitor (RC) time constant, $R_{PU} \times C$, is much higher than the expected time between transitions or edges of CLK. Thus, if the input clock is operating normally, switch 104 is closed often enough to prevent resistor 101 from charging capacitor 102 past the comparator trip voltage. However, when the clock stops functioning, switch 104 remains open and capacitor 102 is charged up towards $V_{DD}$. Once the voltage across capacitor 102 passes the trip voltage, $V_{TR}$, of comparator 106, loss-of-clock signal 107 goes to logic '1', indicating that the input clock has stopped.

Referring to FIGS. 2A–C, in a typical timing diagram of the LOC detector function, the input clock signal CLK is monitored for rising and falling edges whose presence holds the voltage across the capacitor 102 low, and thus the loss-of-clock signal (LOCFLG) is held low as shown. Following the final transition of the disrupted input clock, after the detection time, $T_{LOC}$, the output of the loss-of-clock detector 100, LOCFLG, is asserted high.

In an ideal case, the value of $T_{LOC}$ would be a specific number of clock periods (cycles). However, due to the impreciseness of manufacturing tolerances of integrated circuits, the value of $T_{LOC}$ varies greatly. Referring to FIG. 2C, the desired detection time window is typically set by system level concerns such as detecting the disruption of a clock within a certain time interval of the disruption occurring. The desired detection time window opens (begins) a small time interval, $T_{DECMIN}$, after the final transition of the disrupted input clock. The desired detection time window closes (ends) after a larger time interval, $T_{DECMAX}$, following the final transition of the disrupted input clock. Manifestly, $T_{DECMAX}$ is greater than $T_{DECMIN}$, and $T_{DECMIN}$ may be zero, which means the desired detection window opens coincident with the final transition of the input clock. An operational (functional) loss-of-clock detector 100 asserts LOCFLG so that $T_{LOC}$ is greater than $T_{DECMIN}$ and less than $T_{DECMAX}$. When the input clock signal is restored, transitions or edges resume. As shown, coincident with the first transition of the restored input clock, the loss-of-clock signal is de-asserted low.

A drawback to this prior art LOC detector is that the detection time, $T_{LOC}$, is set by the $R_{PU} \times C$ time constant. Accordingly, manufacturing variations in $R_{PU}$ or C, which can be for example as large as 50% of the nominal component values, or variation of $R_{PU}$ with chip temperature, which can be for example as large as 20% over the specified operating temperature range of most integrated circuits, limit how precisely $T_{DECMIN}$ and $T_{DECMAX}$ can be controlled, thus leading to a large detection time window. In addition, since $R_{PU}$ and C are fixed quantities, the time constant $R_{PU} \times C$ does not vary with the frequency of the input clock, $F_{CLK}$. Thus when $F_{CLK} >> 1/(R_{PU} \times C)$, a significant number of clock periods pass before the circuit detects that the clock has been lost.

Alternative LOC detector architectures that partially overcome these drawbacks are also known from the prior art; however, each of these architectures introduces a new set of drawbacks. For example, pull-up resistor 101 in FIG. 1 can be replaced by a constant current source; the resulting time constant that controls $T_{LOC}$ is insensitive to resistor variation. However, this circuit requires a well-controlled current source, which may require a manual tuning process; further, this improvement fails to mitigate the effect of capacitor variation, or the variation of frequency of the input clock.

An LOC detector can also be implemented without any precision analog components by using a secondary clock and digital circuitry to sample the primary input clock, keeping track of how much time has elapsed since the previous transition. Obviously, this requires a second clock, something that may not be available in every system. Further, if the secondary clock itself fails, the detector that monitors the primary clock will also fail.

SUMMARY OF THE INVENTION

Briefly stated, an apparatus for detecting a failure of an input clock and generating a loss-of-clock signal includes a frequency-to-current converter for generating a charging current substantially proportional to a frequency of the input clock, capacitor for accepting the charging current and providing a terminal voltage that changes in response to the charging current, an edge detector receiving the input clock signal as an input and producing an output pulse on an edge of the input clock signal, a first switch coupled to the capacitor such that the capacitor is discharged to a reference potential when the first switch is closed, and wherein the first switch is controlled by the edge detector to close when the edge detector output pulse is asserted, and comparator for generating a loss-of-clock signal when the voltage on the capacitor passes (i.e., exceeds or drops below) a specified value of trip voltage.

The frequency-to-current converter of the loss-of-clock detector of the present invention avoids the disadvantages of prior art circuits by providing a value of output current substantially linearly proportional to the frequency of the input clock and to a second capacitor whose capacitance tracks the capacitance of the first capacitor. As a result, $T_{LOC}$ is substantially equal to a fixed number of clock periods and virtually independent of varying clock frequency, manufacturing process variations, and chip temperature, allowing for a significant narrowing of the desired detection time window over current state of the art circuits.

DESCRIPTION OF THE PREFERRED EMBODIMENT

Figure 1:
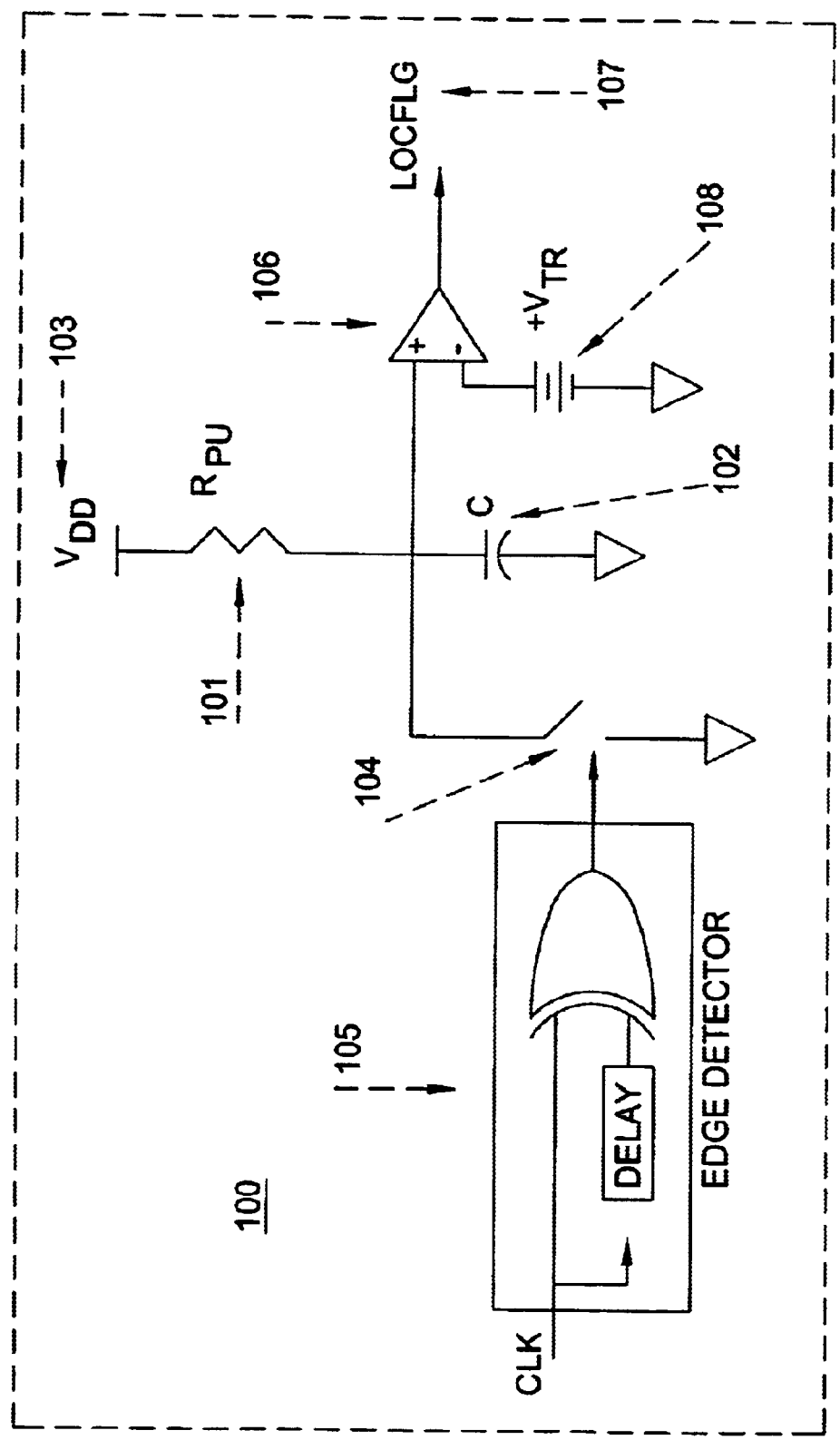
FIG. 1 shows a schematic overview of a loss-of-clock (LOC) detector according to the prior art.
Figure 2:
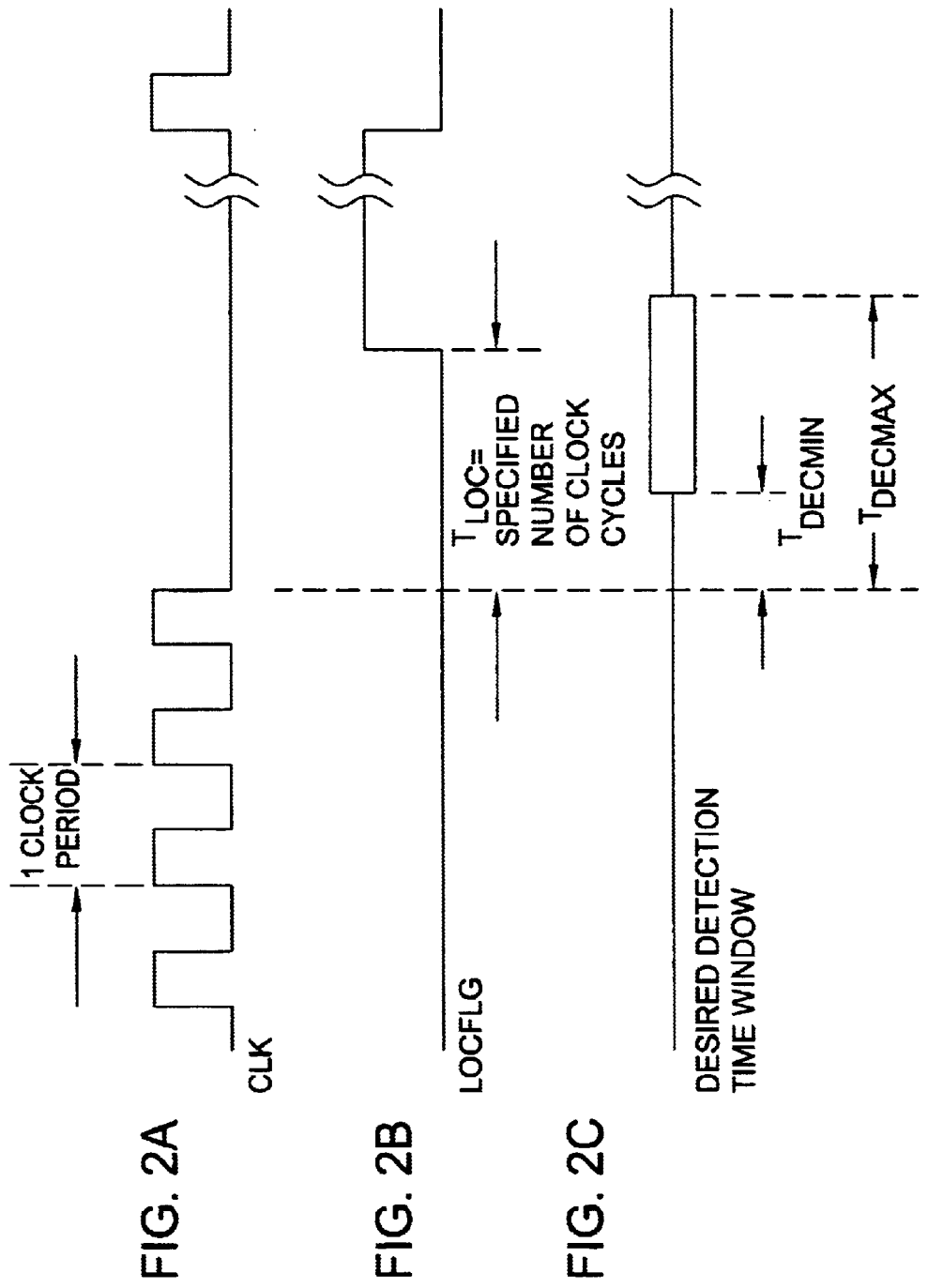
FIG. 2A shows a timing diagram for an input clock that is temporarily disrupted.
FIG. 2B shows a timing diagram for a loss-of-clock signal set in relation to the input clock of FIG. 2A.
FIG. 2C shows a timing diagram for the desired detection time window in relation to the input clock of FIG. 2A and the loss-of-clock signal set in FIG. 2B.

To assist in a better understanding of the invention, a specific embodiment of the present invention will now be described in detail. Although such is the preferred embodiment, it is to be understood that the invention can take other embodiments. This detailed description will include reference to FIGS. 1 through 8. The same reference numerals will be used to indicate the same parts and locations in all the figures unless otherwise indicated. For example, various portions of the description make reference to MOS transistors. Although such transistors are preferable, as is apparent to one skilled in the art another type of transistor could be used without substantively altering the invention, including without limitation bipolar junction transistors or junction field-effect transistors.

Figure 3:
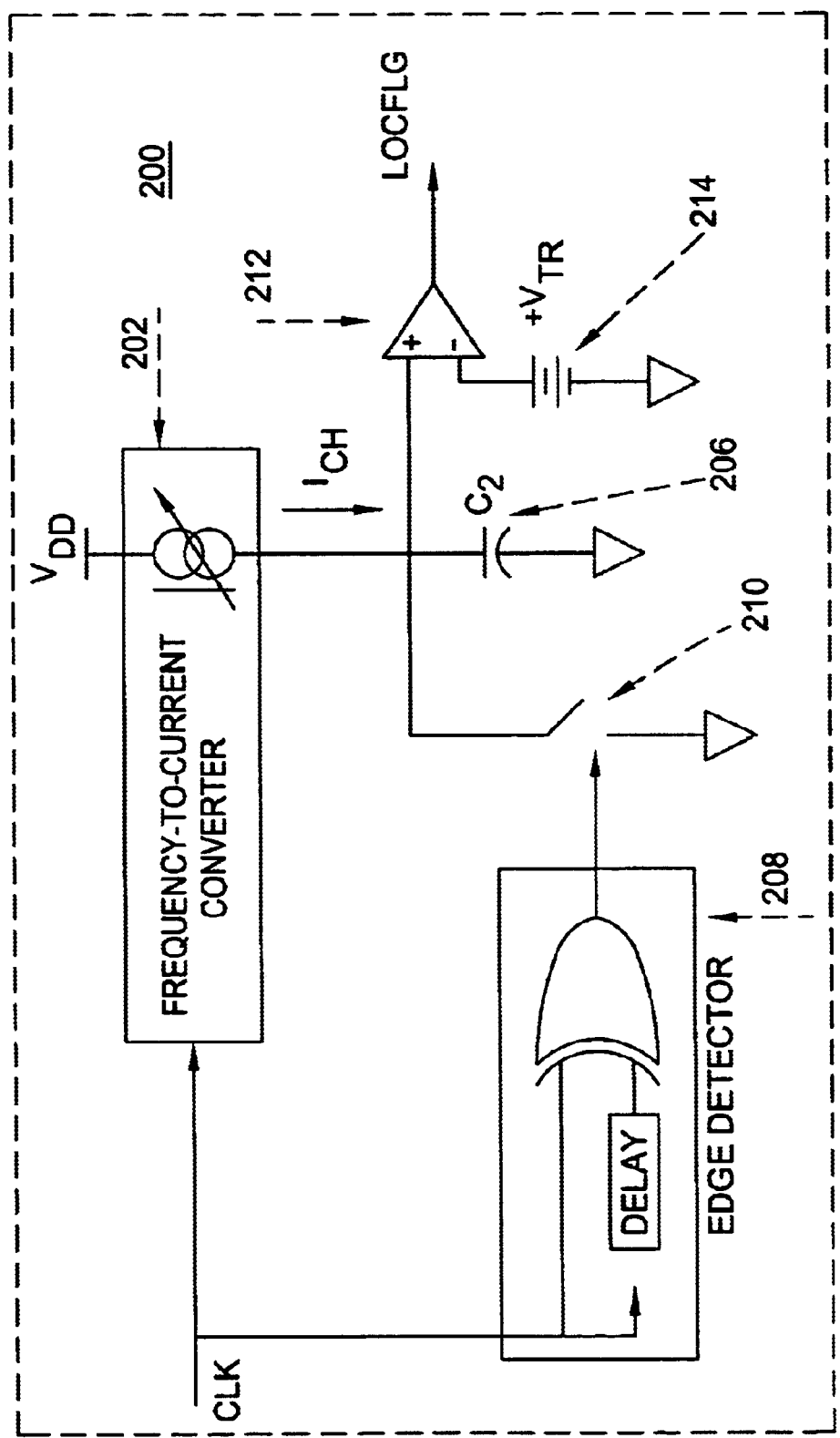
FIG. 3 shows a schematic overview of a loss-of-clock (LOC) detector according to the present invention.

Referring to FIG. 3, a loss-of-clock (LOC) detector 200 includes a frequency-to-current converter 202, to which the clock signal CLK is input.

The current output of frequency-to-current converter 202, labeled $I_{CH}$ in FIG. 3, is substantially directly proportional to the frequency of the input clock, $F_{CLK}$, and thus substantially inversely proportional to the period of the input clock, $T_{CLK}$. That is, $$I_{CH} = K_{F2I} \times F_{CLK} = \frac{K_{F2I}}{T_{CLK}}, \quad (1)$$

where $K_{F2I}$ is a proportionality constant. This output current charges a capacitor 206 having a capacitance designated $C_2$. This capacitor is preferably a MOS gate capacitor. However, other capacitor types could be used in the present invention, as is readily apparent to one skilled in the art. These capacitor types include without limitation, a semiconductor junction capacitor, a linear analog capacitor, or a capacitor formed by two or more layers of interconnect separated by interlayer dielectric.

The input clock signal CLK is also received by an edge detector 208, which on every edge of CLK outputs a pulse DISCH that momentarily closes a switch 210. The duration of this pulse is sufficient to allow switch 210 to completely discharge capacitor 206 to ground. Between CLK edges, capacitor 206 is charged toward $V_{DD}$ by $I_{CH}$. If the time between successive CLK transitions is too long, the voltage across capacitor 206 becomes greater than a trip voltage, $V_{TR}$, of a comparator 212, set by a voltage reference 214, thus causing signal LOCFLG to transition to logic '1'. The time between the final transition of CLK and the assertion of LOCFLG, $T_{LOC}$, is equal to the time required to charge capacitor 206 to the comparator trip voltage. Since this charging time is proportional to the capacitance $C_2$ and inversely proportional to $I_{CH}$, it can be seen that $T_{LOC}$ is proportional to the period of the input clock, $T_{CLK}$:

$$T_{LOC} = \frac{C_2 V_{TR}}{I_{CH}} = \frac{C_2 V_{TR}}{K_{F2I}} T_{CLK} \quad (2)$$

where $V_{TR}$ is the trip voltage of comparator 212. The goal is to make the equation for $T_{LOC}$ independent of the constants $C_2$ and $V_{TR}$. The solution of the present invention is to make $I_{CH}$ substantially proportional to $V_{TR}$ and to a second capacitor whose value tracks $C_2$, as is further explained below.

LOC detector 200 is capable of maintaining a narrow desired detection time window over a wide range of frequencies; however, the range is ultimately limited by non-idealities in the transfer function of the frequency-to-current converter. One source of nonideality which is not necessary to the practice of the invention, but which is contained in the preferred embodiment, is a small constant current, also known as a trickle current, which is independent of the clock frequency. This trickle current is added to the output of converter 202 to ensure that the LOC signal will eventually be asserted even if no input clock is ever applied to the circuit.

Figure 4A:
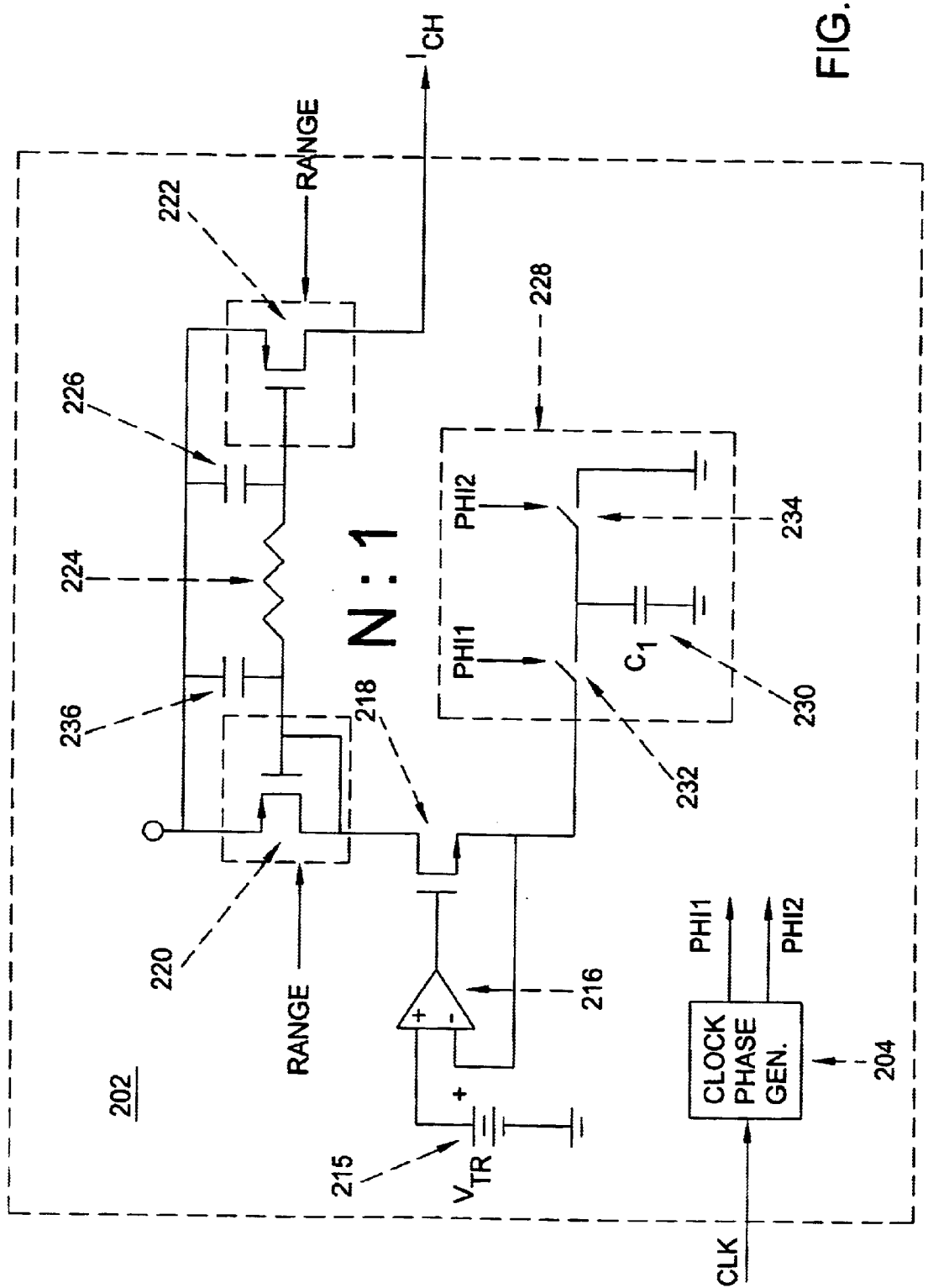
FIG. 4A shows a schematic diagram of an embodiment of a frequency-to-current converter according to the present invention.

FIG. 4A illustrates the preferred embodiment of frequency-to-current converter 202. In this circuit, a noninverting input terminal of an operational amplifier 216 is driven by voltage reference 215, the voltage of this voltage reference is substantially proportional to the trip voltage of comparator 212 in loss-of-clock detector 200. Operational amplifier 216 drives the gate of an n-type transistor configured as a source follower 218, and the drain current of this transistor flows through a diode-connected transistor 220. Transistor 220 and a transistor 222 form a current mirror with a ratio of N:1 between the left and right sides of the mirror as shown. A low-pass RC filter formed by a resistor 224 and a capacitor 226 effectively passes the DC component of the gate voltage of transistor 220 to transistor 222, and the drain current of transistor 222 is the output current, $I_{CH}$. The source of transistor 218 is coupled to a switched-capacitor circuit 228, and also to the inverting input terminal of operational amplifier 216. This connection forms a negative feedback loop that causes the voltage of this node to return to substantially $V_{TR}$ if it is disturbed.

Two clock phases, Phi1 and Phi2, are generated from the main input clock, CLK, by a clock generator circuit 204 such that they have equal frequencies but are non-overlapping; that is, Phi1 is asserted only after Phi2 has been de-asserted, and Phi2 is asserted only after Phi1 has been de-asserted. The period of Phi1 and Phi2, $T_{Phi1,2}$, is either equal to or is a whole number multiple of the period $T_{CLK}$ of CLK. The ratio $$M = \frac{T_{Phi1,2}}{T_{CLK}}$$

depends upon the implementation of clock generator 204.

Circuit 228 is a switched-capacitor circuit that includes a grounded capacitor 230, of value $C_1$, and a pair of switches 232, 234 respectively controlled by complementary clock signals Phi1 and Phi2 derived from CLK by clock generator 204. When Phi1 is active, switch 232 is closed, and the voltage across capacitor 230 is charged to $V_{TR}$. When Phi2 is active, switch 234 is closed and capacitor 230 is discharged to ground. Thus, captor 230 is alternately charged to $V_{TR}$ and discharged to ground at a frequency equal to $$F_{Phi1,2} = \frac{1}{T_{Phi1,2}}.$$

Since the current delivered to capacitor 230 flows through transistor 220, the average current in this transistor is substantially equal to $$\overline{I_{220}} = \frac{C_1 V_{TR}}{M \times T_{CLK}}, \quad (3)$$

where $$M = \frac{T_{Phi1,2}}{T_{CLK}}.$$

A characteristic of switched-capacitor circuit 228 is that it creates a current spike in transistor 218 immediately after switch 232 is closed; a capacitor 236 has been included to limit the effect of this current spike on the gate-source voltage of transistor 220.

It is understood by one skilled in the art that the noninverting input terminal of operational amplifier 216 may be coupled instead to a voltage proportional to $V_{TR}$. In such a case, the equations described herein are modified with the appropriate proportionality factor.

The output of frequency-to-current converter 202, $I_{CH}$, is a current substantially equal to the average current $\overline{I_{220}}$ of transistor 220 scaled by k/N $$I_{CH} = \left(\frac{k}{M \times N}\right)\frac{C_1 V_{TR}}{T_{CLK}} \quad (4)$$

where $T_{CLK}$ is the period of the input clock signal CLK, 1/N is the ratio of the width/length ratio of transistor 222 to the width/length ratio of transistor 220, and k is a proportionality constant to incorporate other circuit factors. Thus, the time to assertion of LOCFLG (FIG. 2) is given by $$T_{LOC} = \frac{C_2 V_{TR}}{\left[\frac{k}{M \times N}\right]\frac{C_1 V_{TR}}{T_{CLK}}} = \frac{(M \times N)}{k}\left[\frac{C_2}{C_1}\right]T_{CLK} \quad (5)$$

Based on equation (5), $T_{LOC}$, measured in units of clock periods, in FIG. 2B is given by $$\frac{M \times N}{k}\left(\frac{C_2}{C_1}\right).$$

Thus, the number of clock periods to assert the loss-of-clock signal can be adjusted by changing the current mirror ratio, N, or by changing the clock divider ratio between CLK and Phi1 and Phi2, M, or by changing the capacitor ratio $C_2/C_1$, or by changing k. In the preferred embodiment, all three ratios are chosen to minimize the area occupied by transistors 220 and 222 and by capacitors 230 and 206.

An additional control signal, RANGE (not shown) can be added as an input to the frequency-to-current converter 202. The RANGE control is used to select the sizes of the current mirror transistors 220 and 222 in FIG. 4A, adjusting their operating point for optimum matching. In most integrated circuit manufacturing processes, the degree to which transistors can be matched is limited. Thus it is widely known in the art that current mirrors composed of transistors with large aspect ratios (the ratio of width to length of a transistor) should not carry low currents, since such mirrors are often poorly matched. Referring to FIG. 4A, transistors 220 and 222 must have aspect ratios large enough to accommodate the large values of $I_{220}$ and $I_{CH}$ at the maximum specified input clock frequency. Thus, if the range of possible input clock frequencies is very large, these transistors carry an unfavorably low level of current when $F_{CLK}$ is very low, and the matching is poor, compromising performance. In the preferred embodiment, the range of input clock frequencies is split into two pieces, and the additional control input, RANGE, is used to select the sizes of transistors 220 and 222 which are appropriate for each piece. When the input clock frequency is large, the RANGE control input selects transistor sizes with larger aspect ratios. When the input clock frequency is small, the RANGE control input selects transistor sizes with smaller aspect ratios.

The embodiment for RANGE control as described above uses two (in this case) distinct sets of transistors for two different frequency ranges. This type of range approach can be referred to as "distinct mode".

Alternatively, RANGE control may be accomplished with a different circuit architecture (hereinafter, "accumulative mode") in which one set of transistors is always selected to be active. The second set of transistors may be selected into the circuit (i.e., "accumulated" in) for the higher frequency range.

Although the embodiment described here divides the input frequency range into only two pieces or sets, it is apparent to one skilled in the art that the concept of selecting current mirror sizes for optimum matching can be extended to as many sets of frequency ranges as is deemed appropriate.

An advantage of the accumulative mode is that a smaller overall circuit area may be achieved because some circuitry is reused for more than one frequency range. This advantage in area reduction may become more important when the number of frequency ranges is increased from two.

Figure 4B:
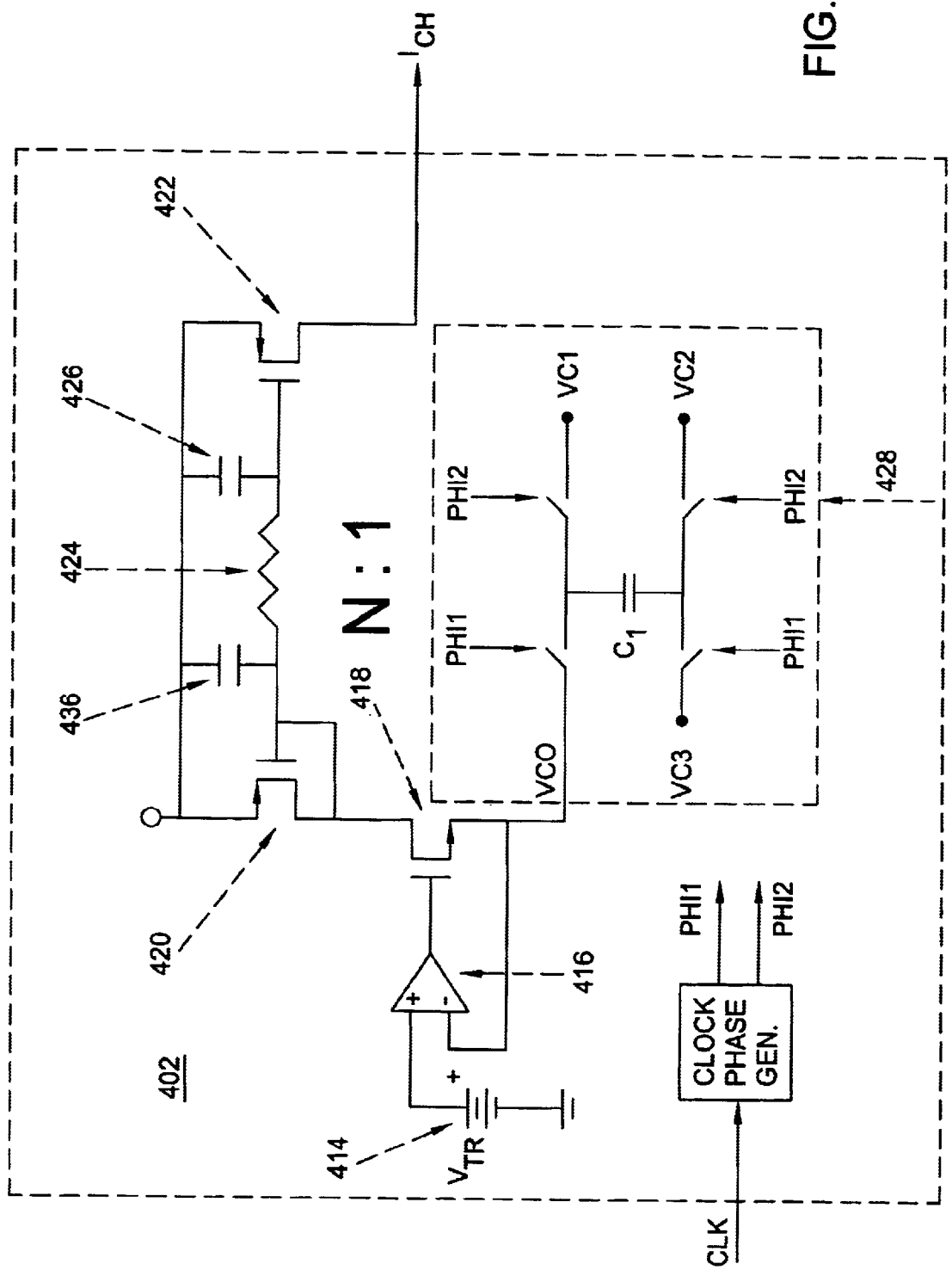
FIG. 4B shows a schematic diagram of an alternative embodiment of a frequency-to-current converter according to the present invention.

Referring to FIG. 4B, in an alternative embodiment to that illustrated in FIG. 4A capacitor 430 has its top plate switched between nodes VC0 and VC1 by clocks Phi1 and Phi2 respectively, and its bottom plate switched between nodes VC2 and VC3 respectively by clocks Phi2 and Phi1 respectively. It is apparent to one skilled in the art that the average current I420 flowing through the transistor 420 is substantially equal to $$\overline{I_{420}} = k \times C_1 \frac{(VC_0 - VC_3) - (VC_1 - VC_2)}{M \times T_{CLK}},$$

where k is a proportionality constant.

Hence the presence of voltages VC0 to VC3 allows a larger average current for the same capacitance C1, or alternatively, a smaller capacitance (hence a saving in chip area) for the same average current I420.

Moreover, one can make node VC1, still a node separate from node VC0, but substantially equal in average voltage to the average voltage of node VC0. This results in a parasitic insensitive implementation, as is apparent to one skilled in the art. Namely, the parasitic capacitance CP1—e.g., comprised of wiring and other parasitic capacitance from the "top" (it is assumed that the top plate is switched between nodes VC0 and VC1) plate of C1 to ground—will no longer contribute any substantial average current to I420 when switched between nodes VC0 and VC1. Parasitic capacitance CP2 (comprised of wiring and other parasitic from the bottom plate of C1 to ground) never contributes substantial average current to I420.

The parasitic implementation still allows a magnification of available current I420, if voltage VC2–VC3 is chosen to be larger than $V_{TR}$.

$$I_{420} = k \times C_1 \frac{(VC_2 - VC_3)}{M \times T_{CLK}}$$

It may be desirable for either embodiment to contain circuitry that provides a DC level shift between the output of the operational amplifier and the gate of the source follower transistor, by techniques known to those skilled in the art. A DC level shift may be desirable in that it helps set the DC quiescent point of the operational amplifier output to be such that the average input referred DC offset voltage of the operational amplifier is substantially zero. As a result, the DC voltage at the source of the source follower can be made to be substantially closer to $V_{TR}$.

Figure 5:
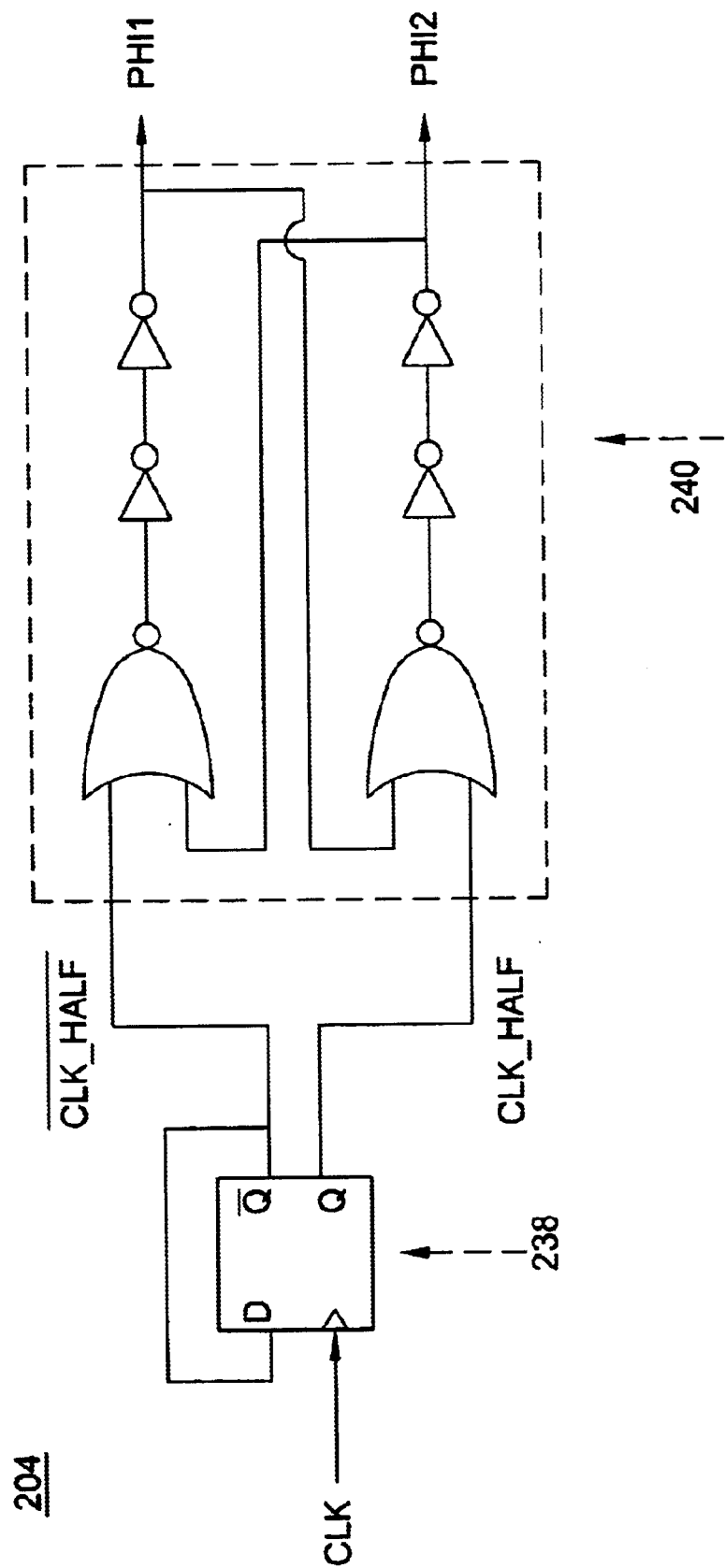
FIG. 5 shows a schematic diagram for an embodiment of a clock generator according to the present invention.

FIG. 5 shows the preferred embodiment of clock generator 204 that includes a D flip-flop 238 and a nonoverlapping clock generator 240. D flip-flop 238 is configured to generate a secondary clock, CLK_HALF, which has a frequency that is half the frequency of the primary input clock, and from which nonoverlapping clock generator 240 generates the complementary nonoverlapping phases Phi1 and Phi2. The use of D flip-flop 238 ensures that the clock signal from which these phases are derived has a duty cycle near 50%, thus freeing the main input clock, CLK, from this restriction. In this implementation, Phi1 and Phi2 have a frequency equal to one half the frequency of CLK; thus M=2 in equations (3), (4), and (5). Implementations required for generating other values of M are widely known to those skilled in the art.

The circuit may be optimized for different frequency ranges not only for more appropriate biasing and associated matching behavior (as described above), but also to permit more flexibility in adjusting circuit parameters (e.g., in response to widely diverse frequencies of operation).

Alternative methods of adjusting circuit operation may include programmability of any of the terms in equation 5. For example, M may be adjusted by inserting a programmable amount of clock division when generating $T_{PHI}$ from $T_{CLK}$. N may be adjusted by selecting in or out appropriate subsections of transistor circuitry on either side of the current mirror. C2 may be adjusted by programmably selecting in or out appropriate amounts of capacitance. C1 may be adjusted in a similar way. All such changes can be implemented in distinct mode or accumulative mode (or combination).

Moreover, the source follower transistor may be broken up into two or more parallel transistors whose gates are coupled together and whose sources are coupled together. Their separate drains may be optionally coupled to the current mirror or to VDD programmably.

This allows more flexibility in biasing the transistors configured as source followers, and provides an additional design factor in circuit operation. Namely this added design factor is the ratio of total average current coupled to the current mirror (by the source follower devices) divided by the total average current coupled by the switched-capacitor circuit to the sources of the source follower devices.

Finally, it may be desirable to scale the trickle current programmably in response to different frequency ranges. This may be done for example by adjusting programmably the appropriate current mirror used to realize the trickle current.

Figure 6:
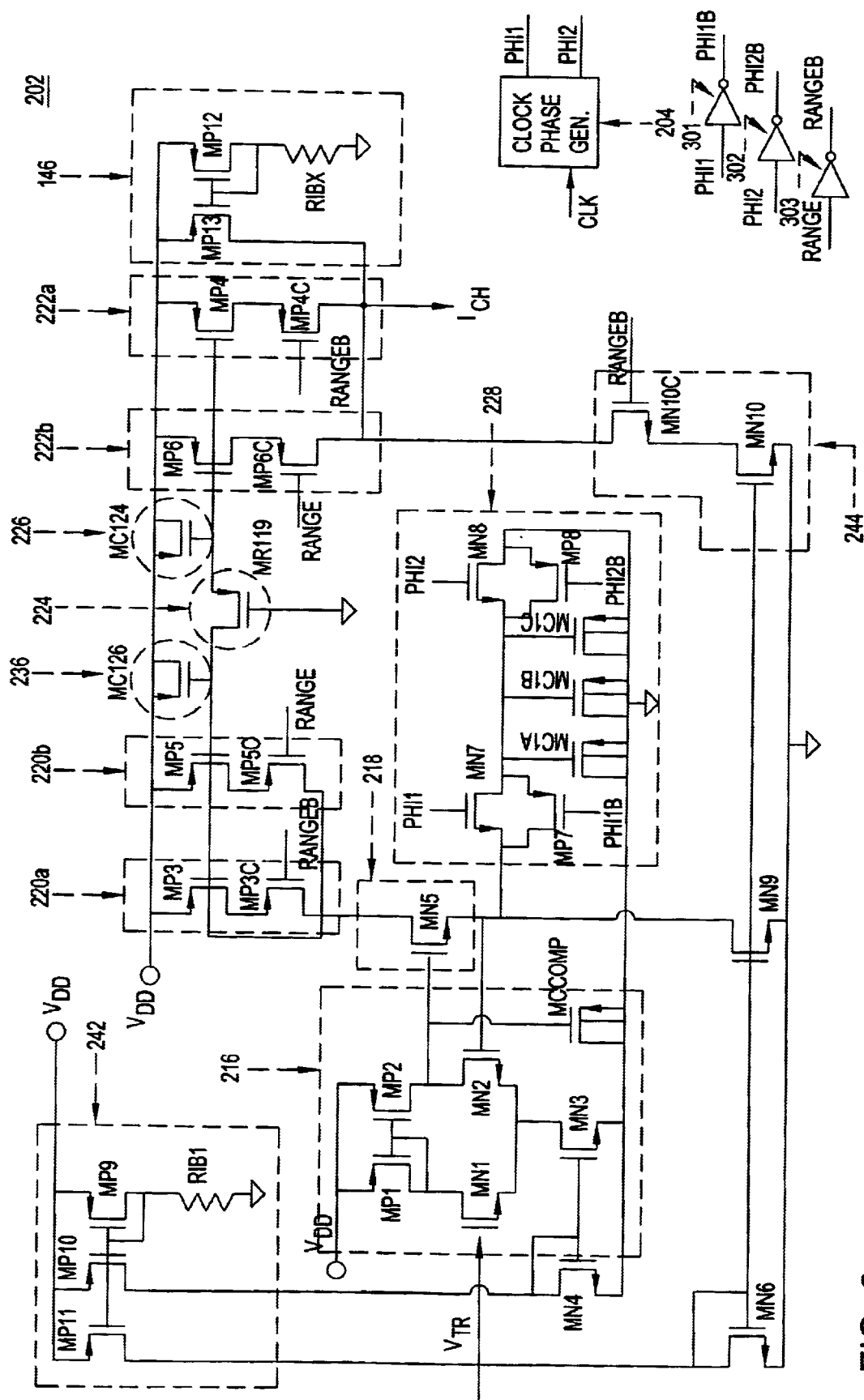
FIG. 6 shows a schematic diagram of a frequency-to-current converter according to the present invention.

Referring to FIG. 6, a detailed schematic for frequency-to-current converter 202 includes operational amplifier 216 whose output drives the gate of MN5, which comprises source follower 218. Operational amplifier 216 consists of transistors MP1, MP2, MN1, MN2, MN3, and MCCOMP. Transistors MN1 and MN2 form the source-coupled input pair of operational amplifier 216, with the gate of MN1 acting as the noninverting operational amplifier input terminal, and the gate of MN2 acting as the inverting input terminal. Transistor MN3 is the tail current source for operational amplifier 216. Transistor MCCOMP is biased in accumulation mode and acts as a compensation capacitor for operational amplifier 216.

In FIG. 6, switched-capacitor circuit 228 is comprised of transistors MN7, MN8, MP7, MP8, MC1A, MC1B, and MC1C. Transistors MN7 and MP7 comprise switch 232 (shown in FIG. 4A), and are closed when Phi1 is asserted high and Phi1*b* is asserted low. Transistors MN8 and MP8 comprise switch 234 (shown in FIG. 4A), and are closed when Phi2 is asserted high and Phi2*b* is asserted low. Inverters 301 and 302 generate Phi1*b* and Phi2b, the logical complements of Phi1 and Phi2. Transistors MC1A, MC1B, and MC1C are MOS capacitors, which together comprise capacitor 230 in FIG. 4A. MC1B and MC1C are added in parallel with MC1A to account for the parasitic input capacitance of comparator 212 that acts in parallel with capacitor 206 in FIGS. 3 and 7.

The drain terminal of MN5 is coupled to a pair of current mirrors, each of which is split into two halves, corresponding to transistors 220 and 222 in FIG. 4A. The additional control signal RANGE, described above, and its complement RANGEB, generated by inverter 303, are shown here. Circuit 220*a*, comprised of transistors MP3 and MP3C, and 222*a*, comprised of MP4 and MP4C, are the left and right halves, respectively, of the first mirror, while 220*b*, comprised of MP5 and MP5C, and 222*b*, comprised of MP6 and MP6C, are the left and right halves of the second mirror. When RANGE is logic '1', transistors MP3C and MP4C are turned on and thus current mirror 220*a*–222*a*, which is assumed to be comprised of large aspect-ratio transistors, is active. When RANGE is logic '0', transistors MP5C and MP6C are turned on and thus current mirror 220b–222b, which is assumed to be comprised of smaller aspect-ratio transistors, is active.

An accumulative implementation is achieved by keeping current mirror 220b–222b to be always on during circuit operation. For example, this may be achieved by connecting the gates of devices MP5C and MP6C to ground. Moreover, it may be desirable to resize current mirror 220a–222a to preserve the total effective current mirror size (i.e., width/length ratio) for the RANGE=1 setting.

As shown in FIG. 4A, the left and right halves of the current mirrors are separated by an RC low-pass filter, that includes resistor 224 and capacitor 226. In the preferred embodiment, transistor MC226, configured as an inversion capacitor, comprises capacitor 226, while resistor 224 is created by using a linear region MOS transistor, MR224. Transistor MC236, biased as an inversion capacitor, corresponds to capacitor 236 of FIG. 3. It is understood by one skilled in the art that both capacitors 226 and 236 can be implemented using any of a variety of capacitor types, and resistor 224 can be implemented using any of a variety of resistor types, including without limitation those typically available in integrated circuit manufacturing processes.

It is also understood by one skilled in the art that the RC low-pass filter has sufficiently low bandwidth relative to clock frequency that substantially only the DC component is present in the charging current. Moreover, the RC low-pass filter has sufficiently high bandwidth as dictated by other design considerations such as chip area. The bandwidth of the RC low-pass filter may be adjusted programmably or in response to use in different frequency ranges.

Subcircuit 242 consists of transistors MP9, MP10, MP11, and resistor RIB1. A trickle current, which is mirrored by MP10 and MP11, is set up by resistor RIB1 and diode-connected transistor MP9. The current from MP10 is sunk by transistor MN4 and mirrored by transistor MN3 to act as the tail current of operational amplifier 216.

The drain current of MP11 is mirrored by transistor MN6 to transistors MN9 and MN10. The resulting trickle current in MN9 passes through source-follower transistor 218, ensuring that this transistor is always on, even if the input clock stops and switched-capacitor circuit 228 is not switching.

This also means that during normal operation the drain current of MN9 is added to the current from switched-capacitor circuit 228 and mirrored by current mirror 220a–222a or 220b–222b, resulting in an error in the value of $I_{CH}$. To reduce this error, an additional subcircuit 244, which includes transistors MN10 and MN10C, subtracts from $I_{CH}$ a current substantially equal to the trickle current added in by transistor MN9. This correction is necessary at low input clock frequencies, as the drain current from MN9 may be roughly the same order of magnitude as the charging current $I_{CH}$.

Note that slightly reducing the size of transistor MN10 ensures that some excess trickle current is present in $I_{CH}$, and thus that there is sufficient current to charge capacitor 206 and assert the loss-of-clock signal even if the input clock is not running upon power-up of LOC detector 200. Alternatively, the excess trickle current can be added specifically by using a circuit such as subcircuit 146. In this circuit, the excess trickle current is generated by resistor RIBX and diode-connected transistor MP12, and mirrored by transistor MP13, thus adding excess trickle current to the primary output current, $I_{CH}$. Because the current mirror formed by MP12 and MP13 carries only a small-magnitude current, the aspect ratios of these transistors may be made small for optimal matching.

Figure 7:
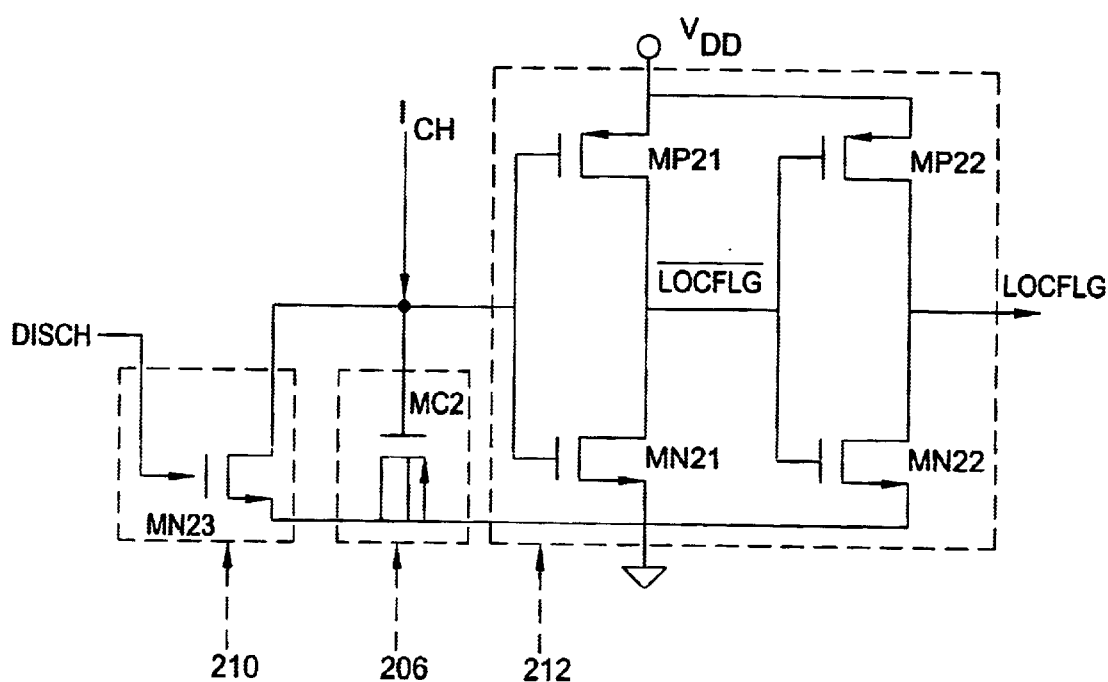
FIG. 7 shows a schematic diagram of a comparator, a capacitor, and a switch, according to the invention.
Figure 8:
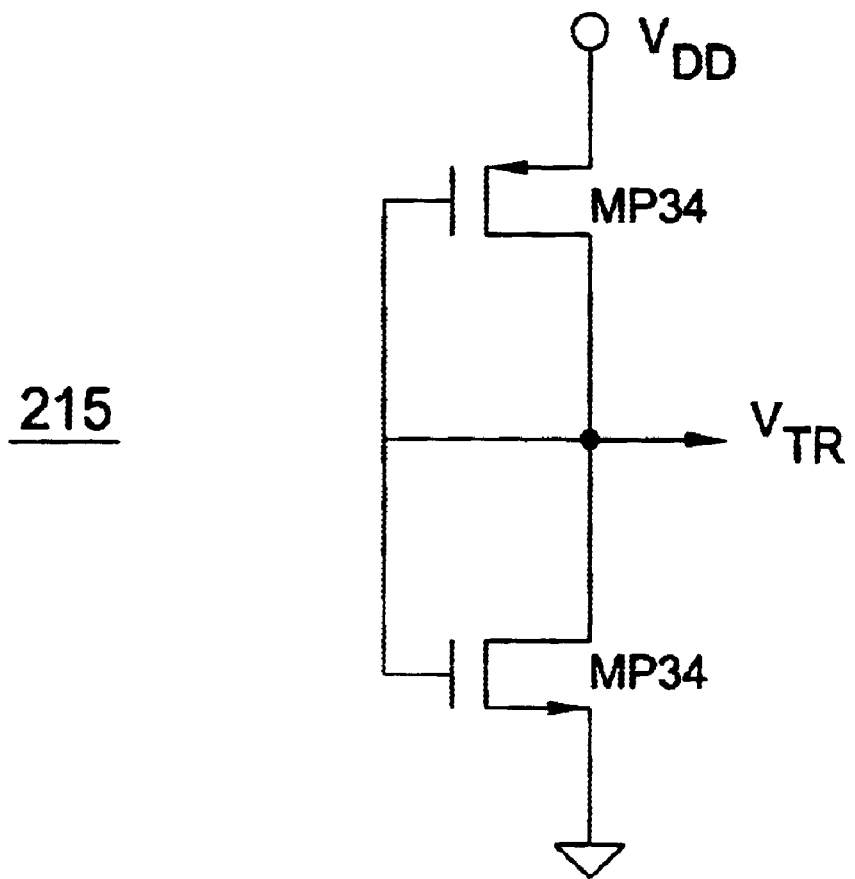
FIG. 8 shows a schematic diagram of a voltage reference according to the invention.

FIG. 7 shows the preferred embodiment of comparator 212, capacitor 206 and switch 210. In this circuit, capacitor 206 is implemented by using a transistor, MC2, configured as an accumulation-mode capacitor. Implementing this capacitor with an MOS device permits the use of a simpler MOS process technology; by implementing the MOS capacitor in accumulation-mode, the total integrated charge is less dependent on threshold voltage when compared to some other modes of implementation. Switch 210 is comprised of transistor MN23. Input DISCH is driven by the output of edge detector 208, turning on transistor MN23 to discharge the capacitance of MC2. The output of frequency-to-current converter 202, current $I_{CH}$, is coupled to input $I_{CH}$ in FIG. 7, and thus this current charges MOS capacitor MC2 towards the trip voltage of comparator 212.

In the preferred embodiment; comparator 212 is implemented as a simple CMOS inverter, comprised of transistors MP21 and MN21. When the voltage across MOS capacitor MC2 passes the trip voltage of the CMOS inverter, the inverter output, LOCFLGBAR, which is the logical complement of the loss-of-clock signal, transitions to a logic '0'. A second CMOS inverter, comprised of transistors MP22 and MN22, generates the loss-of-clock signal, LOCFLG, by logically inverting the LOCFLGBAR signal. If the first inverter's output does not swing completely to power supply or ground, the second inverter also functions to provide an output signal which is more "squared up" (i.e., output levels are closer to power supply and ground).

Unlike the two-input analog comparator shown in FIGS. 1 and 3, the CMOS inverter is a one-input device. The inverter trip-voltage, $V_{TR}$, which is defined as the value of the input voltage at which the inverter input and output voltages are equal, is a function of the dimensions of transistors MP21 and MN21, as well as the characteristics of the manufacturing process. Within the limits imposed by manufacturing variations, a second CMOS inverter comprised of transistors having dimensions which match or are scaled to those of MP21 and MN21 should have an identical trip-point voltage. This fact is used in the circuit of FIG. 8, which is the preferred embodiment of voltage reference 215, whose output is substantially equal to the trip voltage of comparator 212. This circuit consists of a second inverter in which the dimensions of transistors MP34 and MN34 in FIG. 8 match or are scaled to the dimensions of transistors MP21 and MN21. The input and output of this inverter are coupled together; this connection forces the input and output voltages to substantially equal each other, thus forcing the output to the desired inverter trip point voltage, $V_{TR}$. This voltage drives the noninverting input of operational amplifier 216 in frequency-to-current converter 202.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

What is claimed is:

1. An apparatus for detecting and asserting a loss-of-clock signal in response to a disruption of an input clock signal having a rising edge, a falling edge, a frequency and a period, comprising:

a) a frequency-to-current converter which generates a charging current substantially proportional to the frequency of said input clock signal;

b) a capacitor for accepting said charging current which is coupled to said frequency-to-current converter and which has a terminal voltage that changes in response to said charging current;

c) an edge detector receiving said input clock signal as an input and asserting an output pulse on at least one of the rising edge or the falling edge of said input clock signal;

d) a first switch coupled to said capacitor such that said terminal voltage is discharged to a reference potential when said first switch is closed, and wherein said first switch is controlled by said edge detector to close when said edge detector output pulse is asserted; and e) a comparator having a first input coupled to said capacitor and an output, said output asserting said loss of clock signal when said terminal voltage of said capacitor passes a trip voltage, such that a time delay between said input clock signal disruption and said loss-of-clock signal generation is substantially proportional to the period of said input clock signal.

2. An apparatus according to claim 1 wherein said comparator is a two-input voltage comparator having a first input which is coupled to said capacitor and a second input which is coupled to a voltage reference, such that said trip voltage is set proportional to a voltage of said voltage reference.

3. An apparatus according to claim 1, wherein said comparator comprises an inverter having an input which is coupled to said capacitor, an output, and a trip voltage, such that said comparator trip voltage is said inverter trip voltage.

4. An apparatus according to claim 1, wherein said edge detector is configured to produce said output pulse on both said rising edge and said falling edge of said input clock.

5. An apparatus according to claim 1 wherein said reference potential is substantially equal to ground.

6. An apparatus according to claim 1 wherein said frequency-to-current converter comprises:

a) an operational amplifier having a positive terminal and a negative terminal, wherein said positive terminal is coupled to a trip voltage reference having a voltage which is substantially proportional to said trip voltage of said comparator;

b) a non-overlapping clock generator circuit which generates, from said input clock, a Phi1 signal and a Phi2 signal such that said Phi1 signal and said Phi2 signal are complementary non-overlapping clock signals;

c) a switched capacitor circuit comprising a switched capacitor having a first terminal and a second terminal, a Phi1 switch having a first terminal and a second terminal and which is responsive to said Phi1 signal, and a Phi2 switch having a first terminal and a second terminal and which is responsive to said Phi2 signal, wherein said first terminal of said switched capacitor is coupled to said first terminal of said Phi1 switch and to said first terminal of said Phi2 switch, said second terminal of said switched capacitor is coupled to a second reference potential which is substantially equal to said reference potential, and said second terminal of said Phi2 switch is also coupled to said second reference potential;

d) a source follower transistor having a gate terminal, a source terminal and a drain terminal, wherein an output of said operational amplifier is coupled to said gate terminal, and said source terminal is coupled to said second terminal of said Phi1 switch and to said negative terminal of said operational amplifier; and e) a current mirror having an input side and an output side, wherein said input side has a current input and a voltage output and said output side has an current output and a voltage input, and wherein said current input of said input side is coupled to said drain terminal of said source follower transistor, wherein said voltage output of said input side is coupled to said voltage input of said output side, and wherein a current which is output by said current output of said second half of said current mirror is said charging current.

7. An apparatus according to claim 6 further comprising a low-pass RC filter with an input coupled to said voltage output of said input side of said current mirror and an output coupled to said voltage input of said output side of said current mirror.

8. An apparatus according to claim 6 further comprising a second current mirror and control means for controlling which one of said current mirror or said second current mirror is seen by said frequency-to-current converter as being active in said frequency-to-current converter, wherein at least one of said current mirror and said second current mirror is active.

9. An apparatus according to claim 6 wherein said second reference potential is substantially equal to ground.

10. An apparatus according to claim 6 wherein said frequency-to-current converter further comprises a filtering capacitor in parallel with said input of said low-pass RC filter.

11. An apparatus according to claim 1 wherein said frequency-to-current converter comprises:

a) an operational amplifier having a positive terminal and a negative terminal, wherein said positive terminal is coupled to a trip voltage reference having a voltage which is substantially proportional to said trip voltage of said comparator;

b) a nonoverlapping clock generator circuit which generates, from said input clock, a Phi1 signal and a Phi2 signal such that said Phi1 signal and said Phi2 signal are complementary non-overlapping clock signals;

c) a switched capacitor circuit comprising a switched capacitor having a first terminal and a second terminal, a first Phi1 switch having a first terminal and a second terminal and which is responsive to said Phi1 signal, a first Phi2 switch having a first terminal and a second terminal and which is responsive to said Phi2 signal, a second Phi1 switch having a first terminal and a second terminal and which is responsive to said Phi1 signal, a second Phi2 switch having a first terminal and a second terminal and which is responsive to said Phi2 signal, wherein said first terminal of said first Phi1 switch is coupled to said first terminal of said switched capacitor and said second terminal of said first Phi1 switch is said output terminal of said switched capacitor circuit, and wherein said first terminal of said first Phi2 switch is coupled to said first terminal of said switched capacitor and said second terminal of said first Phi2 switch is coupled to a second reference potential, and wherein said first terminal of said second Phi2 switch is coupled to said second terminal of said switched capacitor and said second terminal of said second Phi2 switch is coupled to a third reference potential, and wherein said first terminal of said second Phi1 switch is coupled to said second terminal of said switched capacitor, and said second terminal of said second Phi1 switch is coupled to a fourth reference potential;

d) a source follower transistor having a gate terminal, a source terminal and a drain terminal, wherein an output of said operational amplifier is coupled to said gate terminal, and said source terminal is coupled to said second terminal of said Phi1 switch and to said negative terminal of said operational amplifier; and e) a current mirror having an input side and an output side, wherein said input side has a current input and a voltage output and said output side has an current output and a voltage input, and wherein said current input of said input side is coupled to said drain terminal of said source follower transistor, wherein said voltage output of said input side is coupled to said voltage input of said output side, and wherein a current which is output by said current output of said second half of said current mirror is said charging current.

12. An apparatus according to claim 11, further comprising a low-pass RC filter with an input coupled to said voltage output of said input side of said current mirror and an output coupled to said voltage input of said output side of said current mirror.

13. An apparatus according to claim 11 further comprising a second current mirror and control means for controlling which one of said current mirror or said second current mirror is seen by said frequency-to-current converter as being active in said frequency-to-current converter, wherein at least one of said current mirror and said second current mirror is active.

14. An apparatus according to claim 11, wherein said frequency-to-current converter further comprises a filtering capacitor in parallel with said input of said low-pass RC filter.

15. An apparatus according to claim 1, wherein said first switch comprises a transistor having a gate coupled to said output pulse and a source coupled to said reference potential and a drain coupled to said capacitor, whereby said capacitor is discharged when said output pulse is asserted.

16. An apparatus according to claim 1, further comprising a trickle current source coupled to said capacitor.

17. An apparatus according to claim 16 further comprising means for subtracting out a portion of said trickle current.

* * * * *